(12) United States Patent
Kamas et al.

(10) Patent No.: US 6,717,540 B1
(45) Date of Patent: Apr. 6, 2004

(54) SIGNAL PRECONDITIONING FOR ANALOG-TO-DIGITAL CONVERSION WITH TIMESTAMPS

(75) Inventors: Linda A Kamas, Sunnyvale, CA (US); Jochen Rivoir, Magstadt (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/269,706

(22) Filed: Oct. 10, 2002

(51) Int. Cl.$^7$ ............................................. H03M 1/12
(52) U.S. Cl. ........................ 341/155; 341/152; 341/156; 341/158; 341/169
(58) Field of Search ................................ 341/155, 156, 341/158, 153, 159, 160, 152, 161, 122, 118

(56) References Cited

U.S. PATENT DOCUMENTS

| | | | | | |
|---|---|---|---|---|---|
| 4,093,866 A | * | 6/1978 | Kasdan et al. | .......... | 250/559.39 |
| 4,232,302 A | * | 11/1980 | Jagatich | .......... | 341/138 |
| 4,417,233 A | * | 11/1983 | Inoue et al. | .......... | 341/156 |
| 4,774,498 A | * | 9/1988 | Traa | .......... | 341/159 |
| 4,990,917 A | * | 2/1991 | Kohdaka | .......... | 341/159 |
| 5,519,437 A | * | 5/1996 | Nelvig | .......... | 348/162 |
| 5,790,061 A | * | 8/1998 | Norimatsu | .......... | 341/139 |
| 5,877,715 A | * | 3/1999 | Gowda et al. | .......... | 341/122 |
| 5,920,274 A | * | 7/1999 | Gowda et al. | .......... | 341/155 |
| 6,078,444 A | * | 6/2000 | Vishakhadatta et al. | .......... | 360/32 |
| 6,281,828 B1 | | 8/2001 | Kimura et al. | | |
| 6,429,799 B1 | * | 8/2002 | Kamas et al. | .......... | 341/155 |

* cited by examiner

Primary Examiner—Jean Jeanglaude (57) ABSTRACT

A method and apparatus precondition an analog signal and convert the preconditioned signal into a digital representation. The method includes preconditioning the analog signal, generating a quantity N of reference signals, comparing an amplitude of the preconditioned signal to an amplitude of the reference signals to determine whether the preconditioned signal amplitude is greater than, less than or equal to reference signal amplitudes, and producing a timestamp at a time that the preconditioned signal and reference signal amplitudes are equal. The apparatus includes a preconditioner, a reference signal generator and a quantity N of comparators. A comparator of the quantity N of comparators receives the preconditioned signal from the preconditioner, separately receives a reference signal, and produces a digital signal. The preconditioned signal or the analog signal may be reconstructed from the digital representation.

33 Claims, 4 Drawing Sheets

SIGNAL PRECONDITIONING FOR ANALOG-TO-DIGITAL CONVERSION WITH TIMESTAMPS

TECHNICAL FIELD

The invention relates to processing of analog signals. In particular, the invention relates to analog-to-digital conversion of signals using timestamps of characteristic signal events.

BACKGROUND ART

Analog signals are generated by and/or used in a wide variety of devices and systems. In many of these systems, the analog signals serve as a means of transferring information from one portion of the system to another. Devices that make up systems employing analog signals function to generate, modify, receive and/or detect the analog signals. Examples of systems or devices that make use of analog signals include sensors for monitoring environmental or other system conditions and a wide variety of different communications systems.

In many practical situations encountered in the real world, it is necessary or at least desirable to transform analog signals into a digital representation. This is especially true in cases where digital methodologies are used largely to process and analyze the analog signals. For example, most manufacturers of integrated circuits (ICs) employ some form of automated test equipment (ATE) to test the IC products being manufactured. While ATEs are overwhelmingly implemented based on digital technologies, many of the modem ICs that are being manufactured and tested, produce or use analog output signals. This has become particularly true as modern system-on-a-chip devices are transitioned from the concept to the product phase. The problem for the designers and users of ATEs is how to transform analog signals into a format that can be utilized by the digital ATE. A related problem is the reconstruction of the analog signal from the digital representation.

The conventional approach to converting an analog signal into a digital representation is to use an analog-to-digital converter (ADC). Conventional ADCs sample the amplitude of the analog signal or waveform at successive, regularly spaced, points in time. The sampled amplitude values are converted to a digital format (i.e., digitized) by one of several approaches well known in the art. Once digitized, the analog signal is represented by a sequence of digital values representing the amplitudes sampled by the ADC. Normally, timing of the digital values in the amplitude sequence is known implicitly from the conversion scheme being used. Among the commonly employed ADC approaches known in the art are the over-sampling converters, such as the delta-sigma modulator-based ADCs, the successive approximation ADCs, and the so-called flash ADCs. Each of these technologies ultimately produces a string of digital words, each word representing a sampled amplitude value in digital form, in a time sequence at regularly spaced time intervals.

The analog signal can be reconstructed from the digital words produced by the conventional ADC using a digital to analog converter (DAC). The DAC 'reads' or processes each successive digital word in the time-sequence and produces an analog voltage level at a DAC output port that corresponds to each of the words. By reading the digital words in a manner that is consistent with the order and timing of the original analog-to-digital conversion, the DAC can accurately reconstruct the analog signal.

While conventional amplitude sampled analog-to-digital conversion or amplitude sequence analog-to-digital conversion can provide high fidelity conversion of analog signals to a digital form, the conventional ADCs can be costly to implement in some instances. In particular, many of the conventional ADC technologies are not well suited for simple, accurate on-chip implementations. This is especially true when considering on-chip conversion of analog signals for built-in-self-test (BIST) purposes or in design for test (DFT) instances used in conjunction with an external digital ATE. Similarly, the use of conventional ADC approaches as an interface between an analog device and an ATE can pose many problems, not the least of which is the need for extra dedicated resources in the ATE to accommodate the often high data rate digital signals generated by a conventional time-sampling ADC. Finally, the bandwidth of many conventional ADCs is severely limited by the circuitry necessary to affect the analog-to-digital conversion, especially when many bits of amplitude accuracy are desired.

Accordingly, it would be advantageous to be able to convert an analog signal into a digital representation that preserved selected or specific characteristics of the analog signal and that could optionally provide for accurate signal reconstruction from the digital representation. Such a transformation would solve a long-standing need in the area of analog-to-digital signal conversion, especially as the conversion relates to processing and testing of analog signals by digital systems, such as ATEs and communications systems.

SUMMARY OF THE INVENTION

The present invention preconditions an analog signal and converts the analog signal into a digital timestamp representation of the preconditioned signal. The digital representation produced by the present invention effectively records as timestamps the time of occurrence of a plurality of amplitude events within the preconditioned analog signal and by extension, the original analog signal.

In one aspect of the invention, a method of converting an analog signal into a digital representation is provided. The method of converting comprises preconditioning the analog signal to generate a preconditioned signal. The method further comprises producing the digital representation from the preconditioned signal. The digital representation comprises a sequence or set of timestamps. A timestamp is a time record of an amplitude equality event between an amplitude of the preconditioned signal and an amplitude of a reference signal.

In another aspect of the invention, an apparatus for converting an analog signal having an amplitude value to a digital signal is provided. The apparatus comprises a preconditioner that receives the analog signal from an apparatus input and produces a preconditioned signal. The apparatus further comprises a reference signal source that generates separate reference signals of a quantity of N reference signals, where N is an integer equal to or greater than 1. A reference signal may be generated for a finite period of time, depending on the embodiment. The apparatus further comprises a comparator connected to receive the preconditioned signal from the preconditioner. The comparator being further connected to receive the generated reference signals from the reference source. The comparator produces a digital signal at a comparator output. The comparator output is connected to an apparatus output. The produced digital signal comprises a set of timestamps.

In yet another aspect of the invention, a system for converting an analog signal into a digital representation is provided. The system for converting comprises an analog to digital conversion apparatus having an input connected to receive the analog signal, and a quantity N of apparatus outputs, where N is an integer equal to or greater than 1. The analog to digital conversion apparatus preconditions the analog signal and produces a quantity N of separate digital signals at respective apparatus outputs. A digital signal comprises a set of timestamps. The system further comprises a quantity N of transition interval analyzers (TIA). A TIA has an input and an output, wherein a respective apparatus output is connected to the input of a respective TIA. The TIA encodes timing of logic transitions in the digital signal as a sequence of digital words.

Certain embodiments of the present invention have other advantages in addition Is to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention converts an analog signal into a digital representation, the digital representation comprising a sequence of timestamps. The digital representation produced by the present invention records as timestamps the time of occurrence of a plurality of amplitude events within the analog signal. Amplitudes of one or more reference signals define the amplitude events. As such, the digital representation of the analog signal amplitude events can be viewed as a digital timestamp representation of the analog signal. Among other things, the timestamps generated according to the present invention facilitate testing of a device under test (DUT) that generates an analog signal either as an output signal or as a signal internal to the DUT as well as being useful for signal processing in communications systems.

According to the present invention, the analog signal is preconditioned before the preconditioned signal is converted to the digital timestamp representation. The digital timestamp representation of the preconditioned signal may be used independently or in combination with a digital timestamp representation generated for the analog signal before preconditioning. Kamas et al., in U.S. Pat. No. 6,429,799 B1, and Jochen Rivoir in a co-pending patent application, Ser. No. 09/875,848, filed Jun. 6, 2001 and entitled "Analog-to-digital Signal Conversion Method and Apparatus", both of which are incorporated by reference herein, disclose generating timestamp representations for an analog signal using time-varying reference signals or reference signals that may be either time-varying or non time-varying.

Advantageously, the timestamps generated from a preconditioned signal correspond to amplitude events in the analog signal that may be different from those used to generate timestamps from the non-preconditioned analog signal. In some cases, the different amplitude events represented by the timestamp sequence generated from the preconditioned analog signal may more directly encode or represent characteristics of interest in the analog signal. Additionally, timestamp representations generated from both the original analog signal and the preconditioned analog signal provide more information than timestamp representations generated from either one separately or individually.

In addition, the digital timestamp representation of either the preconditioned analog signal or the combination of the preconditioned signal and the original analog signal, along with information regarding specific preconditioning and the reference signal or signals, can be used to reconstruct a 'sampled' analog signal from the digital timestamp representation. The reconstructed sampled analog signal can be used by a test system to evaluate the analog signal itself or to evaluate the performance of a DUT that produced the analog signal. Alternatively, the timestamps can be used directly, without analog signal reconstruction, to test or evaluate the analog signal and/or the DUT. Such testing can include, but is not limited to, pass/fail testing and/or analog characteristic testing based on device specifications and signature analysis. The term 'signature analysis' as used herein refers to comparing timestamps produced for the DUT to equivalent timestamps produced for a device that is known to be a 'good device'. By 'good device' it is meant that the device operates in accordance with device specifications.

For the purposes of discussion herein, an analog signal S(t) is defined as a signal having an amplitude s(t) that varies or takes on non-discrete values as a function of time. Preferably, the analog signal has a time-varying signal amplitude s(t) that can be described by a continuous function of time. More preferably, the time-varying signal amplitude s(t) can be described by a smooth, continuous function of time. The term 'smooth' as used herein with reference to a function of time means that at least a first derivative with respect to time of the function describing the time-varying signal amplitude s(t) exists and is defined for all time t greater than zero but less than a maximum time $T_{max}$.

Figure 1:
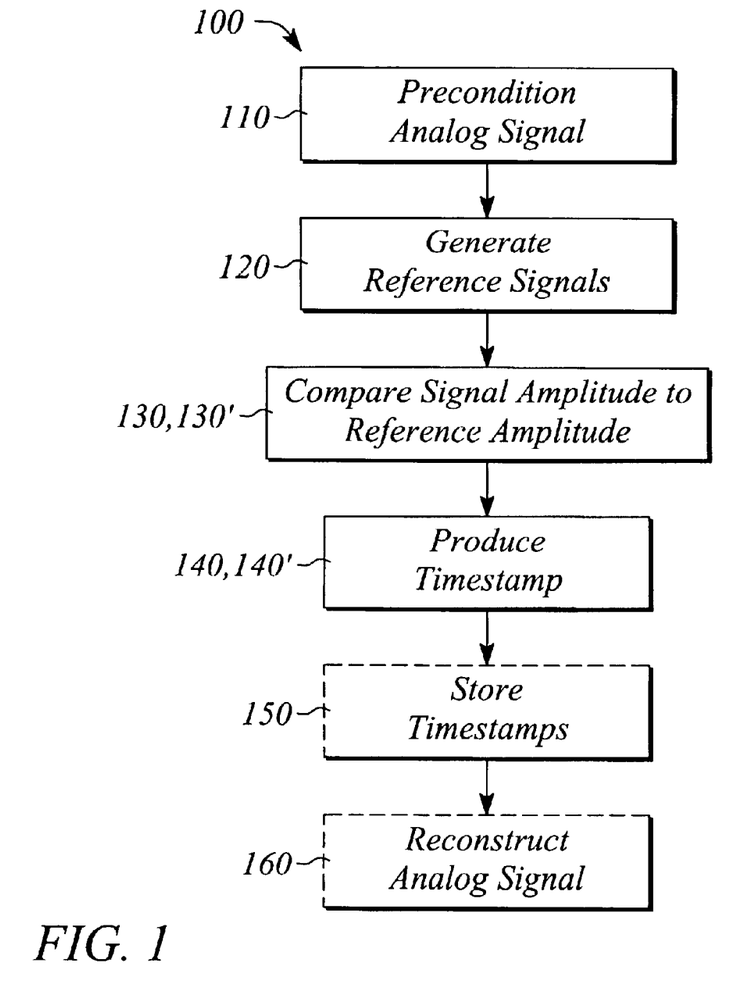
FIG. 1 illustrates a flow chart of a method of converting according to an embodiment of the present invention.

In one aspect of the invention, a method 100 of converting an analog signal S(t) into a digital representation, the digital representation comprising a sequence of timestamps, is provided. FIG. 1 illustrates a flow chart of the method of converting 100 of the present invention. The method 100 of converting comprises preconditioning 110 the analog signal S(t). Preconditioning 110 transforms the analog signal S(t) into a preconditioned signal S'(t). Preconditioning 110 may include, but is not limited to, differentiation, integration, and filtering of the analog signal. For example, differentiation comprises determining a slope or equivalently, a first derivative of the analog signal S(t). Differentiation may be employed as the preconditioning 110 to produce the preconditioned signal S'(t).

Furthermore, preconditioning 110 may include non-constant or time-varying preconditioning 110. For example, a filter employed to precondition 110 the analog signal S(t) may have characteristics that change as a function of time. As such, a lowpass or a highpass filter having a time-varying corner frequency or a bandpass filter having a time-varying center frequency may be used for time-varying preconditioning 110. One skilled in the art is familiar with a variety of types of signal preconditioning that may be applied to precondition 110 the analog signal S(t), all of which are within the scope of the present invention.

The method of converting 100 further comprises generating 120 a quantity N of reference signals $R_i(t)$, where i=1, ..., N and N is equal to or greater than one. The reference signals $R_i(t)$ are different from one another. Preferably, each member of the quantity N of reference signals $R_i(t)$ is different from other members thereof. Thus, an i-th reference signal $R_i(t)$ is not equal to a j-th reference signal $R_j(t)$ for all i≠j, where i, j=1, ..., N. In some embodiments, the reference signals $R_i(t)$ are time-varying reference signals. In particular, the time-varying reference signals $R_i(t)$ include reference signals that vary in time such as, but not limited to, sinusoidal signals, and reference signals that vary both in time and in frequency such as, but not limited to, so called frequency 'chirped' time-varying signals and other such frequency modulated time-varying signals. The use of time-varying reference signals $R_i(t)$ that include time/frequency-varying signals may facilitate a randomization of working-point dependent, non-ideal characteristics of a comparator used to compare the preconditioned signal to the reference signals $R_i(t)$, for example.

In other embodiments, the reference signals $R_i(t)$ are not time-varying and may be represented as a fixed quantity $P_i$ (i.e., $R_i(t)=P_i$, t>0 where $P_i$ is a function having a fixed value). For simplicity of discussion hereinbelow and without loss of generality or scope, the non time-varying reference signal $P_i$ and the time-varying reference signal $R_i(t)$ are both represented herein as the 'reference signal $R_i(t)$'.

Thus, individually the reference signal $R_i(t)$ of the quantity N of reference signals $R_i(t)$ can be any signal having an amplitude that is either constant or that varies or takes on non-discrete values as a function of time in a manner that is known a priori. That is to say, the reference signal $R_i(t)$ is a 'known' signal. Preferably, the i-th reference signal $R_i(t)$ has a signal amplitude $r_i(t)$ that can be described by a waveform that is a continuous function of time. In general, the waveform may be constant, periodic or aperiodic. A periodic waveform is one in which the waveform repeats with a period T while an aperiodic waveform is non-repeating. In practice, either constant or periodic waveforms are preferred since constant waveforms and periodic waveforms typically are easier to generate 120 than aperiodic waveforms. More preferably, a waveform or waveforms are chosen that can be easily and inexpensively generated 120.

In addition, although not required, preferably for time-varying reference signals $R_i(t)$ the signal amplitudes $r_i(t)$ of the reference signals $R_i(t)$ span an expected amplitude range of the preconditioned signal S'(t). Spanning the expected range helps to insure that the preconditioned signal S'(t) is adequately sampled by the reference signals $R_i(t)$. The signal amplitudes $r_i(t)$ of the time-varying reference signals $R_i(t)$ span an expected amplitude range of the preconditioned signal S'(t) if at least one of the reference signals $R_p(t)$ has a minimum amplitude value $r_p(t)=rmin_p$ that is less than or equal to an expected minimum value smin' of the amplitude S'(t) of the preconditioned signal S'(t) and at least one of the reference signals $R_q(t)$ has a maximum amplitude value $r_q(t)=rmax_q$ that is greater than or equal to an expected maximum value smax' of an amplitude s'(t) of the preconditioned signal S'(t).

Examples of waveforms suitable for use in describing the reference signal $R_i(t)$ include, but are not limited to, a constant value waveform, a sine wave, a sawtooth wave, a triangle wave, a chirp, a ramp, a square wave, a multi-level stepped wave, and a wave having a pseudo-random amplitude variation with respect to time. Generally, waveforms having either a zero slope, such as a constant value waveform, or a finite slope, such as a sine wave or a chirp waveform, are preferred since discontinuities in the slope or regions of non-finite slope can introduce ambiguities in the digital representation. Waveforms, such as the sawtooth wave, that do have one or more regions of non-finite slope can be used in conjunction with the present invention by removing timestamps associated with time intervals of the regions of non-finite slope. Time gating is one approach to removing timestamps generated during regions of non-finite slope in the reference signal $R_i(t)$ waveform. One skilled in the art would readily identify other suitable waveforms for use in defining the reference signal $R_i(t)$. All such reference signal $R_i(t)$ waveforms and combinations thereof are within the scope of the present invention.

The method of converting 100 further comprises comparing 130 the preconditioned signal S'(t) to the reference signals $R_i(t)$. Preferably, the preconditioned signal S'(t) is compared 130 to each reference signal $R_i(t)$ in the quantity N of reference signals. During comparing 130, preferably the amplitude s'(t) of the preconditioned signal is compared to the amplitude $r_i(t)$ of each of the reference signal $R_i(t)$ in the quantity N of reference signals. A determination is made as to whether the preconditioned signal amplitude s'(t) at a time of comparison $t_c$ is either greater than, less than, or equal to the amplitude $r_i(t)$ of a respective reference signal $R_i(t)$.

Comparing 130 may be done either in parallel by simultaneously comparing 130 the preconditioned signal amplitude s'(t) to all N of the reference signal amplitudes $r_i(t)$ or by sequentially comparing 130' the preconditioned signal amplitude s'(t) to a first reference signal amplitude $r_1(t)$ followed by comparing 130' the preconditioned signal amplitude s'(t) to a second reference signal amplitude $r_2(t)$ and so on, until the reconditioned signal amplitude s'(t) has been compared to the N-th reference signal amplitude $r_N(t)$. In the case where the preconditioned signal S'(t) is a periodic signal, sequentially comparing 130' may comprise comparing 130' the preconditioned signal amplitude s'(t) to different ones of the reference signal amplitudes $r_i(t)$ during successive periods of the preconditioned signal S'(t).

Preferably, comparing 130, 130' is performed continuously or nearly continuously with respect to time. In other words, a time difference between two adjacent times of comparison $t_{c1}$, $t_{c2}$ called a 'comparison interval' is preferably small and more preferably very small. Comparing 130, 130' can be viewed as a conversion of the preconditioned analog signal S'(t) to a time representation where 'time' is the time of occurrence of a crossing or an equality event with respect to a reference signal $R_i(t)$. The crossing or equality event occurs when the preconditioned analog signal S'(t) amplitude s'(t) crosses or is equal to the reference signal $R_i(t)$ amplitude $r_i(t)$.

The method of converting 100 further comprises producing 140 a timestamp corresponding to the time of occurrence of a given reference signal $R_i(t)$ and preconditioned signal S'(t) equality event. Thus, a timestamp is produced 140 when the amplitude s'(t) of the preconditioned signal S'(t) is observed to be equal to or to 'cross' the amplitudes $r_i(t)$ of the reference signals $R_i(t)$, resulting in a sequence of timestamps. The sequence of timestamps can be represented as a set of N sequences of timestamps, the sequences having time values $t_k$ where k=1, . . . , K, and where K is greater than or equal to one. Since the reference signals $R_i(t)$ are known a priori, the amplitude values $r_i(t_k)$ are also known for all time values $t_k$. Thus, the sequence of timestamps corresponds to a sequence of amplitude values $s'(t_k)$ of the preconditioned signal S'(t). Comparing 130 and producing 140 are repeated for time t less than the maximum time $T_{max}$, and preferably for all time t. Essentially, producing 140 can be viewed as a conversion from a time representation to a digital representation.

Figure 2:
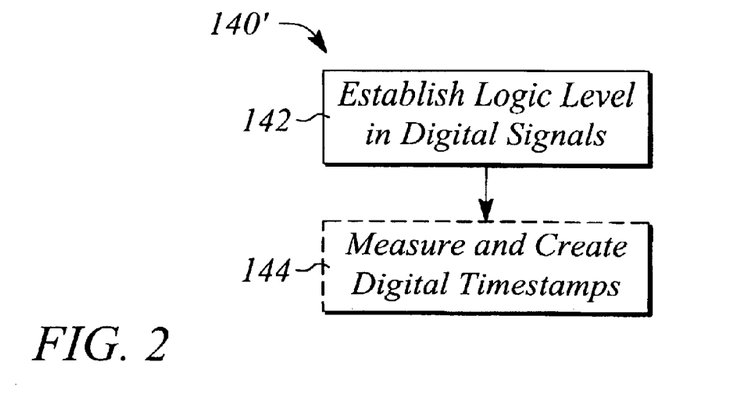
FIG. 2 illustrates a flow chart of a representative embodiment of producing timestamps according to an embodiment of the method of converting illustrated in FIG. 1.

In a representative embodiment of the method 100, producing 140' timestamps introduces logic transitions in a quantity N or digital signals $D_i$, where a relative timing of the logic transition represents the timestamps. A flow chart of the representative embodiment of producing 140' of the method 100 is illustrated in FIG. 2. Producing 140' comprises establishing 142 a logic level in the digital signals $D_i$, and preferably in each of the digital signals $D_i$. In accordance with the method 100, a digital signal $D_i$ is either a time-varying or a non time-varying signal having an amplitude $d_i(t)$ that preferably can take on only one of two allowed logic states or levels at any given point in time t. During establishing 142, a first one of the logic levels is created 142 in the i-th digital signal $D_i$ when the preconditioned signal amplitude s'(t) is greater than the i-th reference signal amplitude $r_i(t)$. A second one of the logic levels is created 142 in the i-th digital signal $D_i$ when the preconditioned signal amplitude s'(t) is less than the i-th reference signal amplitude $r_i(t)$.

Note that, since the preconditioned signal amplitude s'(t) and i-th reference signal amplitude $r_i(t)$ are both described by continuous functions of time t, the amplitude $d_i(t)$ of the i-th digital signal $D_i$ can likewise be described by a continuous function of time t. Moreover, if it is assumed that the preconditioned analog signal amplitude s'(t) at some times exceeds the i-th reference amplitude $r_i(t)$, while at other times it does not exceed the i-th reference amplitude $r_i(t)$, the i-th digital signal amplitude $d_i(t)$ will spend a portion of the time t at the first logic level and another portion of the time t at the second logic level. Furthermore, the points in time t at which the i-th digital signal amplitude $d_i(t)$ transitions between logic states will correspond to points in time $t=t_k$ when the preconditioned analog signal amplitude s'(t) either changes from being greater than to less than the i-th reference amplitude $r_i(t)$ or changes from being less than to greater than the i-th reference amplitude $r_i(t)$. Thus, as a result of the application of the method of converting 100 of the present invention, a logic transition is induced in the t-th digital signal $D_i$ at a time $I=t_k$ that corresponds to the time when the preconditioned signal amplitude s'(t) crosses the reference amplitude $r_i(t)$ (i.e., an i-th equality event). Thus, the transitions effectively serve as timestamps of the equality events.

The producing 140' timestamps of the representative embodiment of method 100 further optionally comprises measuring and creating 144 digital timestamps for the logic transitions in the i-th digital signal $D_i$. Optionally measuring and creating 144 is illustrated as a box having a dashed-line border in FIG. 2. Optionally measuring and creating 144 measures the time of occurrence $t_k$ of a logic transition in the i-th digital signal $D_i$ and converts the time of occurrence $t_k$ of a transition in a format suitable for storing in a computer memory. The converted time of occurrence $t_k$ of a transition is a digital timestamp. Preferably, the conversion is a binary encoding of elapsed time based on a timing clock. Measuring and creating 144 is repeated for each logic transition in each of the digital signals $D_i$. Optionally, additional information may be added to digital timestamps to distinguish timestamps of an i-th digital signal $D_i$ from those of a j-th digital signal $D_j$.

Referring back to FIG. 1, the method 100 of converting optionally further comprises storing 150 the digital timestamps. Optionally storing 150 saves the timestamps for later processing. The timestamps can be optionally stored 150 in computer memory. Storing 150 is optional since the digital timestamps can be used immediately once they have been produced 140, 140' instead of storing 150. Optionally storing 150 is illustrated as a box having a dashed-line border in FIG. 1.

Figure 3:
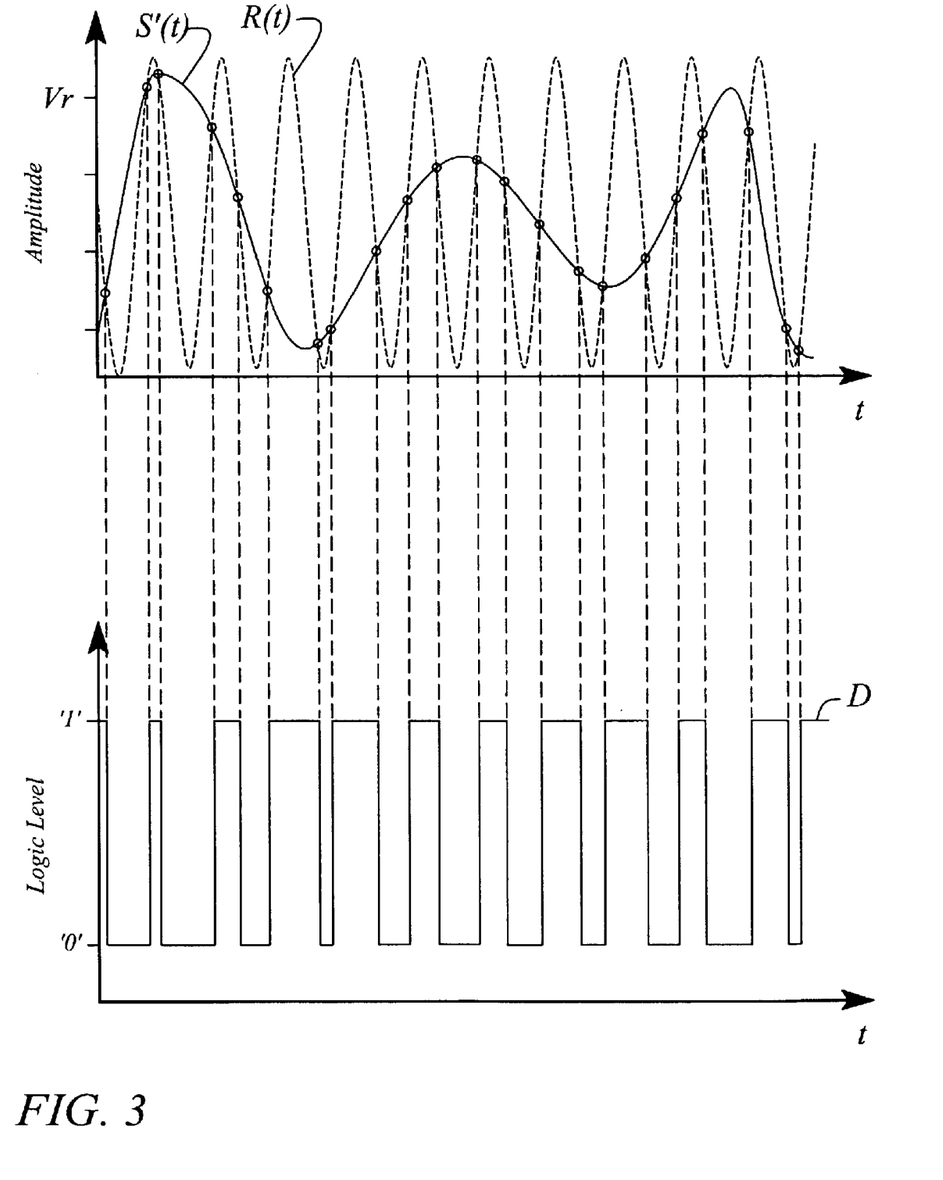
FIG. 3 illustrates a timing graph for an example in which a reference signal R(t) is employed to analyze an analog signal S(t) using an embodiment of a method of converting according to the present invention.

Consider the example illustrated in FIG. 3 in which a single reference signal R(t) is employed (i.e., N=1) to analyze an analog signal S(t). For the purposes of the example, the analog signal S(t) (not illustrated) is preconditioned 110 by an exemplary differentiation. Thus, the preconditioned signal S'(t) is the derivative of the analog signal S(t) for this example.

Referring to FIG. 3, the reference signal R(t) is illustrated as a dashed-line sine wave and the preconditioned signal S'(t) is illustrated as a solid line wave. The amplitude s'(t) of the preconditioned signal S'(t) repeatedly exceeds and then is less than the amplitude r(t) of the reference signal R(t). Differentiation is used to precondition 110 and a sine wave is used for the reference signal R(t) in the example illustrated in FIG. 3 for illustrative purposes only and are not intended to limit the scope of the present invention.

Furthermore for this example assume that, if during comparing 130 it is determined that the preconditioned signal amplitude s'(t) is greater than the reference amplitude r(t), a logic '1' (e.g. d(t)=1) will be produced 140' in an output digital signal D. On the other hand, if it is determined during comparing 130 that the preconditioned signal amplitude s'(t) is less than the reference amplitude r(t), a logic '0' (e.g. d(t)=0) will be produced 140' in the output digital signal D. The results of the application of the method of converting 100 to the preconditioned signal amplitude s'(t) are illustrated in the lower half of FIG. 3 as digital signal D, which has a logic transition that occurs every time the preconditioned signal amplitude s'(t) crosses the reference amplitude r(t). The correspondence between the timing of transitions in the digital signal D and the points where the preconditioned signal amplitude s'(t) crosses the reference amplitude (t) is indicated by the vertical 'dashed' lines in FIG. 3 for convenience of illustration.

As would be readily recognized by one skilled in the art, the choice of which of the two logic values is used to indicate that the preconditioned signal amplitude s'(t) exceeds the reference amplitude r(t) is completely arbitrary according to the invention. The example illustrated in FIG. 3 could just as easily have used a logic '0' to indicate that the preconditioned amplitude s'(t) was greater than reference amplitude r(t) and a logic '1' to indicate that the preconditioned amplitude s'(t) was less than the reference amplitude r(t) and still be within the scope of the invention. Likewise, when the preconditioned signal amplitude s'(t) and the reference amplitude r(t) are equal, the effect on the logic state of the digital signal D can be defined arbitrarily to suit a particular application. For example, the case of equality can be arbitrarily defined to produce 140' one of the two logic states in the digital signal D. Alternatively, the case of equality can be left to have an undefined effect on the logic state of the digital signal D since often it can be assumed that amplitudes s'(t) and r(t) will not be equal for an extended period. One skilled in the art would readily be able to determine such a definition to suit a particular application. All such definitions are within the scope of the invention.

The timestamps or timestamp sequence produced 140, 140' by method 100 can be optionally stored 150 in computer memory for use at a later time or instead the timestamps can be used directly after they are produced 140, 140'. In particular, one use of the timestamps is to reconstruct the analog signal. Thus, the method 100 of conversion optionally further comprises reconstructing 160 the preconditioned signal S'(t) and/or the analog signal S(t) from the timestamp representation. In optionally reconstructing 160, knowledge of the reference signals $R_i(t)$ is used along with the produced 140, 140' timestamps to reconstruct an analog representation of the preconditioned signal S'(t). Knowledge of the preconditioning may then be used to transform the reconstructed preconditioned signal S'(t) into a reconstructed version of the analog signal S(t). In particular, an inverse of the preconditioning transformation may be employed to transform the reconstructed preconditioned signal S'(t) into the reconstructed analog signal S(t). As discussed hereinabove, knowledge of the timestamps, the reference signals $R_i(t)$, and the preconditioning provides unambiguous knowledge of the analog signal S(t) at the times represented in the timestamps.

As already mentioned above, the method 100 of the present invention can be viewed as a method of analog-to-digital conversion that first converts the preconditioned signal S'(t) to a timestamp representation and then converts the timestamp representation to a digital signal representation. The time representation is the timing associated with an equality event in comparing 130. The digital representation in the representative embodiment of producing 140' a timestamp is the quantity N of digital signals $D_i$. The timestamp representation is encoded in the digital signals $D_i$ as the time of occurrence of the produced 140' logic transitions. As an analog-to-digital conversion, the results of the method 100 may contain enough information to reconstruct the analog signal from the digital representation provided the sampling is performed with 'sufficient' resolution. One skilled in the art would readily be able to determine a sufficient resolution for reconstructing a given signal, such as that based on a Nyquist Criteria, without undue experimentation. Nyquist Criteria are well known to those skilled in the art. Alternatively, the analog-to-digital conversion of the method 100 of the present invention can be used to perform pass/fail testing and/or related analog characteristic analysis of a DUT based on device specification or to perform signature analysis of an analog signal in a DUT.

Figure 4A:
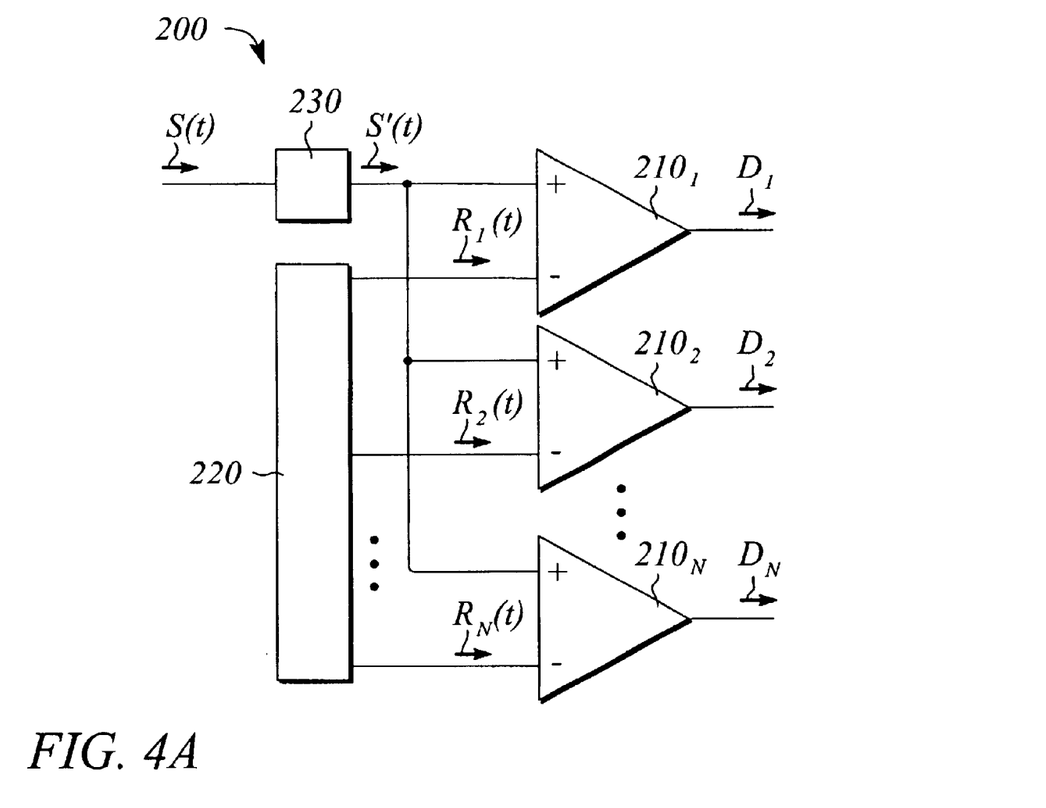
FIG. 4A illustrates a block diagram of a conversion apparatus according to an embodiment of the present invention.
Figure 4B:
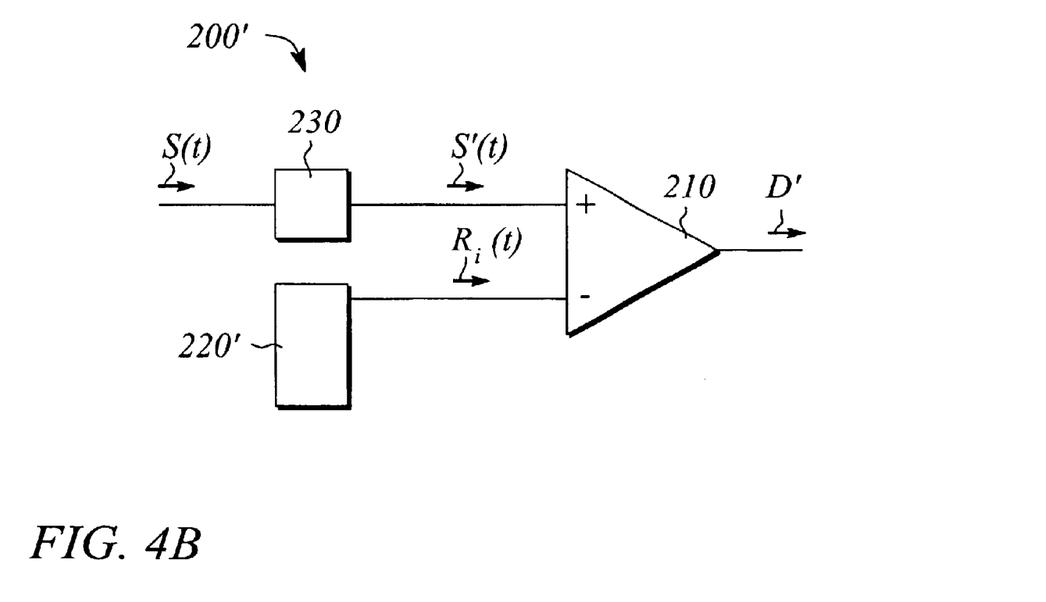
FIG. 4B illustrates a block diagram of a conversion apparatus according to another embodiment of the present invention.

In another aspect of the invention, an analog-to-digital conversion apparatus 200 is provided. The conversion apparatus 200 accepts an analog signal S(t), preconditions the analog signal S(t) to produce a preconditioned signal S'(t), and converts the preconditioned signal S'(t) into the quantity N of digital signals $D_i$, where i=1, . . . , N and N is greater than or equal to 1. A block diagram of the conversion apparatus 200 according to an embodiment of the present invention is illustrated in FIG. 4A. A block diagram of the conversion apparatus 200' according to another embodiment of the present invention is illustrated in FIG. 4B.

Referring to FIG. 4A, the conversion apparatus 200 comprises a quantity N of means for comparing $210_i$, i=1 . . . N. The means for comparing $210_i$ may be a type of comparator $210_i$, for example. Each of the comparators $210_i$ has a first input, a second input and an output. In an alternate embodiment (not illustrated), the means for comparing is a Schmitt Trigger $210'_i$. The comparing means $210_i$ is generally referred to hereinafter without limitation, as a 'comparator'. The first input of the comparator $210_i$ is labeled '+' and the second input is labeled '−'. The comparator $210_i$ is a device known in the art that compares the amplitudes of signals on its inputs and produces an output signal on its output, the level of the output signal being determined by relative values of the signals on the inputs. By convention and as used herein, but not by way of limitation, if a signal amplitude applied to the first input '+' is larger than a signal amplitude applied to the second '−' input, the output of the comparator is 'high'.

For example, an operational amplifier can be used as a comparator $210_i$ for the apparatus 200 of the invention. An operational amplifier is a device that produces an output voltage that is the amplified difference between a voltage applied to a first input terminal and a voltage applied to a second input terminal. Typical operational amplifiers have very large scale or gain factors that multiply or exaggerate the difference. Thus, if a voltage $V_1$ is applied to the first terminal of an operational amplifier and a second voltage $V_2$ that is less than $V_1$ is applied to the second terminal, the output will be a large value $V_{out}=G \cdot (V_1-V_2)$, where G is an open loop gain of the operational amplifier. Generally, the value $V_{out}$ will be observed to swing between two voltages determined by the power supply voltages applied to the operational amplifier for very small differences in the voltages $V_1$ and $V_2$. This is exactly what is desired for the quantity N comparators $210_i$ of the invention. If the voltage $V_1$ is related to the signal amplitude s(t) and the voltage $V_2$ is related to one of the reference signal amplitudes $r_i(t)$, then the operational amplifier will provide the desired comparator function for the apparatus 200. One skilled in the art will readily recognize that there are other suitable approaches for implementing the quantity N comparators $210_i$. All such suitable approaches are within the scope of the present invention.

The apparatus 200 further comprises a reference signal source 220 having N outputs. The reference signal source 220 generates a quantity N of reference signals $R_i(t)$. A reference signal of the quantity is generated at an output of the N outputs. When N>1, the quantity N of reference signals are different from one another and produced at different outputs. A first reference signal $R_1(t)$ generated by the reference source 220 is applied to the second input of a respective first comparator $210_1$. A second reference single $R_2(t)$ is applied to the second input of a respective second comparator $210_2$, and so on, until an N-th reference signal $R_N(t)$ is applied to a second input of a respective N-th comparator $210_N$.

The conversion apparatus 200 further comprises a preconditioner 230 between an input of the apparatus 200 and the respective first inputs of the comparators 210i. The preconditioner 230 may comprise any preconditioning circuit or means for preconditioning known in the art. Preconditioner circuits known in the art include, but are not limited to, an integrator, a differentiator, and a filter. In some embodiments (not illustrated), the preconditioner 230 may be replaced by a plurality of preconditioners $230_i$, a different one the preconditioners 230, for each of the comparators $210_i$. In particular, each of the preconditioners $230_i$ may provide a different preconditioning of the analog signal S(t). Thus, a first preconditioner $230_1$ of the plurality of preconditioners $230_i$ may be an integrator while a second preconditioner $230_2$ of the plurality of preconditioners $230_i$ may be a differentiator, and so on. Therefore, it is within the scope of the present invention to use a single preconditioner 230 connected to the first inputs of the quantity N comparators or to use more than one preconditioner 230, which may be the same type or different types of preconditioners. When more than one preconditioner 230 is used, each preconditioner 230 is connected to one or more of the first inputs of respective one or more comparators $210_i$.

Referring again to FIG. 4A, the analog signal S(t) is applied to the preconditioner 230. The preconditioner 230 transforms the analog signal S(t) into a preconditioned signal S'(t). The preconditioned signal S'(t) is then applied to the first input of the comparators $210_i$, and preferably to each of the comparators $210_i$. An output signal generated by the first comparator $210_1$ is a respective first digital signal $D_1$. An output signal generated by the second comparator $210_2$ is a respective second digital $D_2$, and so on, until an output signal generated by the N-th comparator $210_N$ is a respective N-th digital signal $D_N$. The digital signal $D_i$ comprises a digital representation or format of the preconditioned signal S'(t). The apparatus 200 essentially implements the method 100 described hereinabove.

Referring to the alternate embodiment of the conversion apparatus 200' illustrated in FIG. 4B, the conversion apparatus 200' comprises one comparator 210, having a first input, a second input and an output. A Schmitt Trigger (not illustrated) may be used in place of the comparator 210. The conversion apparatus 200' further comprises a reference signal source 220' having an output. The reference signal source 220' output is connected to the second input of the comparator 210. The conversion apparatus 200' further comprises a preconditioner 230 between an input of the apparatus 200' and the first input of the comparator 210.

An analog signal S(t) is applied to the input of the apparatus 200'. The preconditioner 230 transforms the applied analog signal S(t) into a preconditioned signal S'(t). The preconditioned signal S'(t) is then applied to the first input of the comparator 210. The reference signal source 220' sequentially generates a quantity of N reference signals $R_i(t)$. The arrow labeled '$R_i(t)$' in FIG. 4B indicates the sequence of reference signals $R_i(t)$. Each sequentially generated reference signal $R_i(t)$ is generated and output by the reference signal source 220' for a separate, finite period of time $t_g$.

Thus for example, the first reference signal $R_1(t)$ is generated by the reference signal source 220' and compared to the preconditioned signal S'(t) by the comparator 210 for a respective first period of time. Then the second reference signal $R_2(t)$ is generated by the reference signal source 220' and compared to the preconditioned signal S'(t) by the comparator 210 for a respective second period of time, and so on until the N-th reference signal $R_N(t)$ is generated and compared. The period of time $t_g$ that each of the reference signals $R_i(t)$ is generated by the reference signal source 220' may be, for example, a different period of the preconditioned analog signal S'(t). The output of the comparator 210 is a digital signal representation D' of the preconditioned signal S'(t). The digital signal representation D' is indicated by the arrow labeled D' at the comparator output in FIG. 4B. The digital signal representation D' of this alternate embodiment comprises a sequence of digital signal segments $D_i'$, wherein transitions within each segment are timestamps of equality events for a corresponding reference signal $R_i(t)$ comparison.

Figure 5:
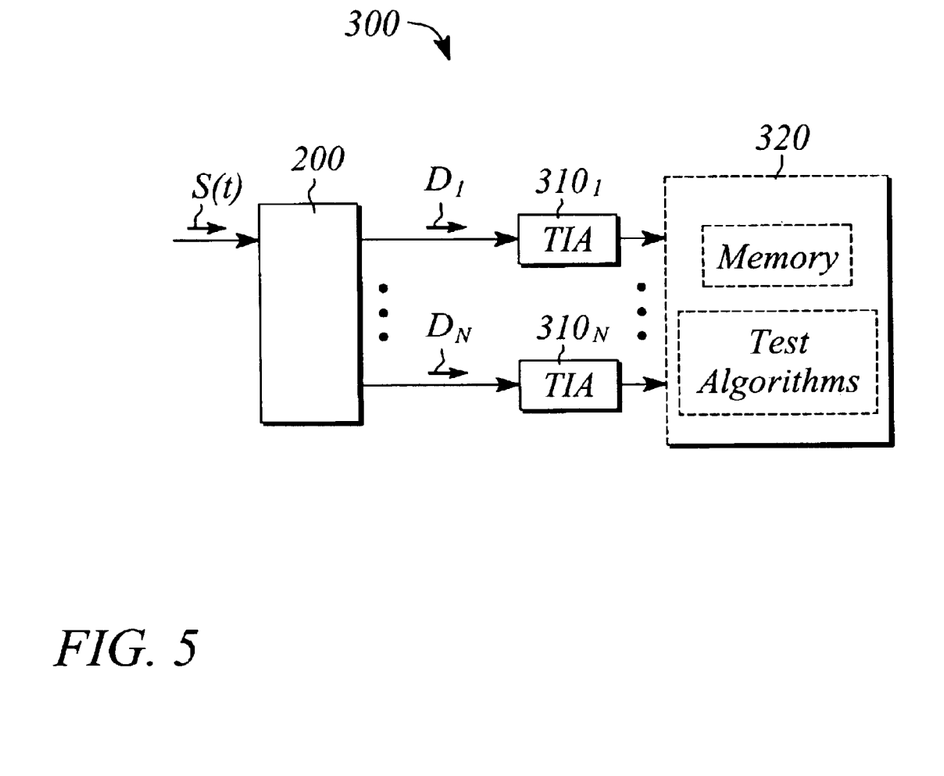
FIG. 5 illustrates a block diagram of a conversion system according to an embodiment of the present invention.

In yet another aspect of the invention, a system 300 for converting an analog signal S(t) is provided. Such a system may be used to convert an analog output signal from a device under test (DUT) or from another source. FIG. 5 illustrates a block diagram of an embodiment of the conversion system 300 of the present invention. The system 300 comprises an analog-to-digital conversion apparatus 200 of the present invention that receives the analog input signal S(t). The conversion apparatus 200 preconditions the analog signal S(t) to produce a preconditioned signal S'(t). The conversion apparatus 200 converts the preconditioned signal S'(t) into a quantity N of digital signals $D_i$, where i=1, . . . , N and N is greater than or equal to 1. As noted hereinabove, the conversion performed by the apparatus 200 essentially encodes the timing of certain predefined amplitude events in the preconditioned signal S'(t) as transitions in the digital signals $D_i$. In other words, the digital signals $D_i$ comprise a sequence of timestamps of the predefined amplitude events.

Referring again to FIG. 5, the system 300 further comprises a quantity N of transition interval analyzers (TIA) $310_i$. A TIA $310_i$ receives a respective digital signal $D_i$ produced by the conversion apparatus 300. The TIA $310_i$ is a device known in the art that measures the time of occurrence of logic transitions in the digital signals $D_i$. Further, TIAs $310_i$ are well known in the art of testing DUTs.

The system 300 optionally further comprises a test equipment 320. The optional test equipment 320 is illustrated as a dashed-line box in FIG. 5 for that reason. The optional test equipment 320 may be, for example, an automated test equipment (ATE) system or another test system. The test equipment 320 has one or more ports that are connected to respective outputs of the quantity N TIAs $310_i$. The TIAs $310_i$ generates a sequence of digital words that encode the timing of the transitions in the respective digital signals $D_i$. The optional test equipment 320 comprises an optional memory for storing the timestamps and an optional test algorithm for analyzing the timestamps. For example, the optional test equipment 320 might use the encoded timing information of the timestamps to recognize and analyze events in the preconditioned signal S'(t). By extension, knowledge of the preconditioning may be employed by the optional test equipment 320 to recognize and analyze events in the analog signal S(t) using the timestamps for the preconditioned signal S'(t).

In one example application of the system 300, the analysis may be used to determine if a DUT meets a specification associated with the events encoded by the digital signals $D_i$. In general, the test equipment 320 stores the timestamps in memory and compares the timestamps using a test algorithm to expected timestamps or other timing information. The comparison performed by the ATE 320 with the test algorithm can then be used, for example, to assess the 'pass/fail' condition of the DUT based on specification for the DUT or to perform signature analysis using expected timestamps produced from a known good device. One skilled in the art would readily be able to choose and configure a TIA $310_i$ for a given ATE 320 and develop a test algorithm that would be suitable for the testing system 300 of the present invention without undue experimentation.

The system 300 excluding the optional test equipment 320 may be implemented as a stand-alone element. For example, the system 300 can be implemented as a DUT test board that interfaces a DUT to an external ATE system. The system 300 may be integrated into a DUT as part of the 'on board' test circuitry of the DUT. Further, the system 300 may be integrated into an ATE. In a representative embodiment, the system 300 is preferably integrated into a device (e.g. DUT) as part of the device's built-in test circuitry. More preferably, only the conversion apparatus 200 is built into the device.

When only the conversion apparatus 200 is built-in, the TIAs 310$_i$ and optional test equipment 320 including the optional memory/algorithms are typically part of an external test system used to test the device, such as an ATE. In other words, the conversion apparatus 200 may be implemented either 'off-chip' or preferably 'on-chip' with respect to the device. An alternate embodiment of the system 300' (not illustrated) comprises all of the elements of the system 300 except for the conversion apparatus 200 which is replaced by the conversion apparatus 200' in the system 300'. For this alternate embodiment, the system 300' comprises a single TIA 310 to receive the digital signal representation D' from the single comparator 210.

Thus, there has been described a novel method of analog-to-digital conversion with signal preconditioning using reference signals to generate a timestamp representation. In addition, a conversion apparatus for converting an analog signal to a digital representation and a system for converting and testing an analog signal are described. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. A method of converting an analog signal into a digital representation comprising:

preconditioning the analog signal to generate a preconditioned signal; and producing the digital representation from the preconditioned signal, wherein the digital representation comprises a set of timestamps, a timestamp being a record of an amplitude equality event between an amplitude of the preconditioned signal and an amplitude of a reference signal.

2. The method of claim 1, wherein preconditioning the analog signal comprises one or more of integrating, differentiating, and filtering the analog signal.

3. The method of claim 1, wherein producing the digital representation comprises comparing the preconditioned signal to the reference signal of a quantity N reference signals, where N is an integer equal to or greater than 1.

4. The method of claim 1, wherein the reference signal is one of a time-varying reference signal or a non-time varying reference signal.

5. The method of claim 1, further comprising reconstructing the analog signal from the set of timestamps, the preconditioning, and the reference signal.

6. The method of claim 1, further comprising producing a digital representation of the analog signal before preconditioning, wherein the digital representations are produced comprising individually comparing the analog signal and the preconditioned signal to the reference signal of a quantity N reference signals, where N is an integer equal to or greater than 1, such that both an analog signal digital representation and a preconditioned signal digital representation are created.

7. A method of converting an analog signal into a digital representation comprising:

preconditioning the analog signal, such that a preconditioned signal is generated;

generating a quantity N of reference signals, where N is an integer equal to or greater than 1, a reference signal of the quantity being one or both of a time-varying reference signal and a non time-varying reference signal;

comparing an amplitude of the preconditioned signal to an amplitude of the reference signal to determine whether the analog signal amplitude is greater than, less than or equal to the reference signal amplitude; and producing a timestamp when the preconditioned signal amplitude equals the amplitude of the reference signal, wherein the timestamp is a record of an amplitude equality event, and wherein the digital representation is a set of timestamps.

8. The method of claim 7, wherein preconditioning comprises one or more of integrating, differentiating, and filtering the analog signal.

9. The method of claim 7, wherein a timestamp of the set comprises a logic level transition in a digital signal.

10. The method of claim 7, wherein the amplitude of the preconditioned signal is compared to the amplitude of each reference signal of the quantity N, and wherein each produced timestamp of the set comprises a logic level transition in a digital signal.

11. The method of claim 9, further comprising measuring and creating a digital timestamp for the logic level transition in the digital signal.

12. The method of claim 7, wherein comparing comprises simultaneously comparing the preconditioned signal amplitude to the reference signal amplitude of each reference signal of the quantity N reference signals in parallel.

13. The method of claim 7, wherein comparing comprises sequentially comparing the preconditioned signal amplitude to the reference signal amplitude of each reference signal of the quantity N reference signals until all of the reference signal amplitudes have been compared.

14. The method of claim 7, wherein the analog signal is a periodic signal and the preconditioned signal is a periodic signal, and wherein during comparing the amplitude of each reference signal of the quantity N reference signals is compared to the amplitude of the preconditioned signal during a different period of the preconditioned signal.

15. The method of claim 9, wherein producing comprises establishing a first logic level in the digital signal corresponding to a respective one of the reference signals when the preconditioned signal amplitude is greater than the respective reference signal amplitude, and establishing a second logic level in the corresponding digital signal when the preconditioned signal amplitude is less than the respective reference signal amplitude.

16. The method of claim 7, further comprising reconstructing one or both of the preconditioned signal and the analog signal before preconditioning from one or more of the set of timestamps, the preconditioning, and the quantity N reference signals.

17. The method of claim 7, further comprising storing the set of timestamps.

18. A method of converting an analog signal from a device under test into a digital signal representation comprising:

preconditioning the analog signal from the device under test, wherein preconditioning comprises one or more of integrating, differentiating, and filtering the analog signal to generate a preconditioned signal;

generating a reference signal;

comparing an amplitude of the preconditioned signal to an amplitude of the reference signal to determine whether the preconditioned signal amplitude is greater than, less than or equal the reference signal amplitude;

producing a first logic level in a digital signal corresponding to the reference signal while the preconditioned signal amplitude is greater than the reference signal amplitude and a second logic level in the digital signal while the preconditioned signal amplitude is less than the reference signal amplitude; and repeating comparing and producing for a period of time to obtain the digital signal representation of the preconditioned signal for the device under test, wherein the digital signal representation comprises representations for a plurality of amplitude equality events.

19. The method of claim 18, further comprising measuring and creating a digital timestamp for each logic level transition in the digital signal.

20. The method of claim 18, wherein the digital signal representation is used to determine if the device under test meets specifications.

21. The method of claim 18, wherein the digital signal representation is used to perform signature analysis of the device under test.

22. An apparatus that converts an analog signal to a quantity N of digital signals, where N is an integer equal to or greater than 1, the apparatus comprising:

a reference signal source having a quantity N of source outputs, the reference signal source generating separate reference signals of a quantity N of reference signals at the source outputs;

a quantity N of comparators connected to the reference signal source, the comparators receiving respective separate reference signals; and means for preconditioning the analog signal connected between an apparatus input and the comparators, the preconditioning means generating a preconditioned signal of the analog signal, the comparators further receiving the preconditioned signal, the comparators producing respective separate digital signals of the quantity N digital signals;

wherein the comparators are connected to separate apparatus outputs of a quantity N of apparatus outputs, and wherein a digital signal of the quantity N digital signals comprises a set of timestamps, a timestamp being a record of an amplitude equality event between an amplitude of the preconditioned signal and an amplitude of a reference signal.

23. The apparatus of claim 22, wherein means for preconditioning comprises one of an integrator, a differentiator, or a filter.

24. The apparatus of claim 22, wherein when N is greater than 1, the comparators simultaneously compare the preconditioned signal amplitude to the different reference amplitudes in parallel.

25. The apparatus of claim 22, wherein when N is greater than 1, the comparators sequentially compare the preconditioned signal amplitude to the different reference amplitudes.

26. The apparatus of claim 22, wherein the comparator is selected from an operational amplifier and a Schmitt Trigger.

27. An apparatus for converting an analog signal having an amplitude to a digital signal comprising:

a preconditioner that receives the analog signal from an apparatus input and produces a preconditioned signal;

a reference signal source that generates separate reference signals of a quantity N of reference signals, where N is an integer equal to or greater than 1; and a comparator connected to receive the preconditioned signal from the preconditioner, the comparator being further connected to receive the generated reference signals from the reference signal source, the comparator producing a digital signal at a comparator output, the comparator output being connected to an apparatus output, wherein the produced digital signal comprises a set of timestamps, a timestamp being a record of an amplitude equality event between an amplitude of the preconditioned signal and an amplitude of a reference signal.

28. The apparatus of claim 27, wherein the reference signal source generates the quantity N of reference signals sequentially, a reference signal being generated for a finite period of time, and wherein the comparator receives the generated reference signals sequentially.

29. A system for converting an analog signal into a digital representation comprising:

an analog to digital conversion apparatus having an input connected to receive the analog signal, and a quantity N of apparatus outputs, where N is an integer equal to or greater than 1, the apparatus preconditioning the analog signal and producing a quantity N of separate digital signals at respective apparatus outputs, wherein a digital signal comprises a set of timestamps, each timestamp being a record of an amplitude equality event between an amplitude of a preconditioned signal and an amplitude of a reference signal; and a quantity N of transition interval analyzers (TIA), a TIA having an input and an output, a respective apparatus output being connected to the input of a respective TIA, the TIA encoding timing of logic transitions in the digital signal as a sequence of digital words.

30. The system of claim 29, further comprising a test subsystem for testing a device under test, wherein the device under test produces the analog signal, the test subsystem having a quantity N of ports, a port being connected to the output of a respective TIA, the test subsystem using encoded timing information in the digital signals as timestamps of events in the preconditioned signal to determine if the device under test meets specifications.

31. The system of claim 29, wherein the analog to digital conversion apparatus comprises means for preconditioning, the preconditioning means being connected to the apparatus input to receive the analog signal, and a quantity N of comparators, a comparator being connected to the preconditioning means to receive the preconditioned signal, the comparator further being connected to receive a reference signal of a quantity N of separate reference signals, the comparator producing a respective digital signal on a comparator output, the comparator output being connected to the respective apparatus output.

32. The system of claim 31, wherein the analog to digital conversion apparatus further comprises a reference signal source producing the quantity N of separate reference signals.

33. The system of claim 30, wherein the test subsystem comprises a memory and a test algorithm, wherein the memory stores device specifications and the preconditioned signal timestamps, and wherein the test algorithm compares the preconditioned signal timestamps to expected timestamps derived from the device specifications or from a measurement of a known good device to assess the operational performance of the device under test.

* * * * *